United States Patent [19]

Tomizawa et al.

[11] Patent Number: 4,905,038
[45] Date of Patent: Feb. 27, 1990

[54] EXPOSURE DEVICE

[75] Inventors: Takashi Tomizawa, Aichi; Shigeyuki Hayashi, Nagoya; Motoshi Ohno, Nagoya; Yoichi Horaguchi, Nagoya; Takashi Nakata, Nagoya, all of Japan

[73] Assignee: Brother Kogyo Kabushiki Kaisha, Japan

[21] Appl. No.: 218,219

[22] Filed: Jul. 13, 1988

[30] Foreign Application Priority Data

Jul. 17, 1987 [JP] Japan .................. 62-179718

[51] Int. Cl.⁴ .............................. G03B 27/32
[52] U.S. Cl. ........................ 355/27; 355/32
[58] Field of Search .......... 355/27, 32, 35, 67, 355/77, 14, 14 E, 72; 430/138

[56] References Cited

U.S. PATENT DOCUMENTS 4,607,941  8/1986  Honda ................... 355/14 E
4,806,984  2/1989  Asano ..................... 355/32

*Primary Examiner*—L. T. Hix
*Assistant Examiner*—Khanh Dang
*Attorney, Agent, or Firm*—Oliff & Berridge

[57] ABSTRACT

An exposure device for use in an image recording apparatus for exposing a photosensitive recording medium to light so as to form a latent image thereon. The device comprises a sheet storage cartridge detachably provided to the image recording apparatus, the cartridge being formed of a light-shielding material for storing therein the photosensitive recording medium and having an exposure zone on an outer surface thereof; exposure means which emits an original image carrying light directing in alignment with the outer surface for exposing the first surface of the photosensitive medium in the exposure zone to light to form the latent image on the photosensitive medium; sheet feeding means driven in timed relation with an exposure for pulling the photosensitive recording medium from the sheet cartridge and positioning the medium at the outer surface; and, a color-tone controlling means fixed to the outer surface and having a reflectivity distribution for exposing the second surface of the photosensitive recording medium for correcting exposure amount with respect to the photosensitive medium with at least one of specific light having at least one of selected wavelengths.

7 Claims, 1 Drawing Sheet

EXPOSURE DEVICE

BACKGROUND OF THE INVENTION

The present invention relates to an exposure device for use in a copying machine, an optical printer, or other image recording apparatus.

Japanese Laid-Open Patent Application Kokai Nos. 58-23025 and 58-88739 disclose a photosensitive sheet suitable for use as a copying sheet which is coated with microcapsules encapsulating chromogenic material (dye precursors), photo-curable resin, a photosensitizer, and a photopolymerization initiator, and also with a color developer which will react with the dye precursors to develop colors. The encapsulated materials and the developer material are co-deposited on one surface of a single substrate as one layer or as two contiguous layers. Such type of image recording medium is generally referred to as self-contained type recording medium as typically disclosed in U.S. Pat. No. 4,440,846.

When light is applied to the coated layer on the photosensitive sheet, those microcapsules which are exposed to light are photo-cured, and those which are not remain unset. Therefore, by subsequently pressing the photosensitive sheet between pressing rollers, the unset microcapsules are ruptured to allow the dye precursors to react with the color developer for producing a desired copy image. Where the photo-sensitive sheet is used as a copying sheet, a copy bearing a high-quality image reproduced with good resolution and sharpness can be produced. Since no toner is employed, unlike copying machines using plain paper, the copying machine which utilizes photosensitive sheets requires easy maintenance.

The photosensitive sheet described above is of the self-contained type. However, a transfer-type photosensitive sheet has also been developed. The transfer-type photo-sensitive sheet is coated with only microcapsules, but not a color developer, and is used in combination with a transfer sheet that is coated with a color developer. After the photosensitive sheet has been exposed to light, the transfer sheet is placed over the photosensitive sheet, and they are placed under pressure to develop an image on the transfer sheet. The transfer-type photosensitive sheet also offers the same advantages as those of the self-coloring photo-sensitive sheet. The transfer type image recording medium is best disclosed in U.S. Pat. No. 4,399,209 in which the developer material is coated on a separate substrate as a separate developer or copy sheet.

A photosensitive sheet, whether it may be of the self-contained type or the transfer-type, is usually held flatwise by being placed on a flat sheet holder or tensioned between two rolls in order to avoid defocusing or image distortion while the photosensitive sheet is being exposed to light. If light emitted from a light source and passed through the photosensitive sheet is reflected by the surface of the sheet holder, the photosensitive sheet is exposed again to the reflected light. When such double exposure is caused, the profile of the image produced by the light coming from the light source tends to be blurred by the subsequent reflected light, resulting in a lower degree of resolution.

The sensitivities at respective wavelengths of photosensitive sheets vary from lot to lot when they are manufactured. Any such varying sensitivities appreciably affect the color-tone or balance and reproducibility of developed colors. To avoid this problem, when an image is to be reproduced in a copying machine using a photosensitive sheet, the data on reference sensitivity levels indicated on the sheet package must be provisionally inputted by an operator into the copying machine. This data input procedure makes the copying process less efficient. Further, the cost of the copying machine must be increased since it must have a data input unit and a color correcting unit.

Commonly assigned co-pending U.S. patent application Ser. No. 089,608 filed Aug. 25,1987 discloses an exposing apparatus which includes a sheet mount for mounting the photosensitive pressure sensitive sheet thereon for exposing the same to light, and a surface-finished reflectivity means provided on a mounting surface of the sheet mount so as to eliminate diffused reflection and to avoid defficiencies attendant to the above-described double exposure.

Further, commonly assigned co-pending U.S. patent application Ser. No. 154,235 filed Feb. 10, 1988 discloses a color-tone controlling method and apparatus at an exposure zone. The latter invention employs a plurality of color-tone controlling plates selectively positioned underneath the photosensitive medium. When an upper surface of the photosensitive recording medium is subjected to irradiation with light which carries one of the color images, the light passing through the sensitive sheet is reflected at the selected color-tone plate whose color is identical with that of the color image, so that the light is again entered into the photosensitive sheet from its lower surface, to thereby attain double exposure for conpensating the color-tone of the resultant color image on the photosensitive sheet. If the photosensitive sheet does not provide its ideal photo-sensitivities, an operator selects one of the color-tone controlling plates for the double exposure so as to obtain color in the final output image.

SUMMARY OF THE INVENTION

In view of the aforesaid shortcomings of the conventional photosensitive sheets, it is an object of the present invention to provide an exposure device for exposing a photosensitive medium to light to produce high-quality images of good color balance, good color reproducibility, high sharpness, and high resolution, while avoiding defocusing and distortion of the images.

Another object of this invention is to provide such exposure device which can eliminates drawbacks attendant to the double exposure, yet providing sufficient clear color image even by the double exposure.

Still another object of the invention is to provide such device capable of providing an excellent final output image regardless of variations of the photo-sensitivities of the photosensitive pressure sensitive sheets, which variations may be observed in every lot to lot in the sheet manufacture.

Still another object of this invention is to provide such exposure device which can eliminate selection of the color-tone controlling plate in accordance with the variations of the photo-sensitivities of the photosensitive recording medium.

According to the present invention, there is provided an exposure device for use in an image recording apparatus for exposing a photosensitive recording medium to light to thereby form a latent image thereon, and the device comprises a sheet storage cartridge, exposure means, sheet feeding means, and a color-tone controlling means. The sheet storage cartridge is detachably provided to the image recording apparatus, and is formed of a light-shielding material for storing therein the photosensitive recording medium when it is installed in the recording apparatus. The cartridge has an exposure zone on an outer surface thereof. The exposure means emits an original image carrying light directing in alignment with the outer surface for exposing a first or front surface of the photosensitive medium in the exposure zone to light to form the latent image on the photosensitive medium. The sheet feeding means is driven in timed relation with an exposure for pulling the photosensitive recording medium from the sheet cartridge and positioning the medium at the outer surface. The color-tone controlling means is provisionally fixed to the outer surface and has a reflectivity distribution for exposing a second (rear) surface of the photosensitive recording medium for correcting exposure amount with respect to the photosensitive medium with at least one of specific light having at least one of selected wavelength.

The light applied to the photosensitive sheet disposed in the exposure zone passes through the photosensitive medium to the color-tone controlling means with the correcting reflectivity distribution. This controlling means has light reflectivities selected at respective wavelengths dependent on the sensitivities and color balance of the photosensitive medium. Variations caused in the sensitivities of the photosensitive medium in the manufacturing process can be corrected by applying light reflected from the color-tone controlling means again to the photosensitive medium.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

An exposure device according to the present invention is shown hereinbelow as being incorporated in a color copying machine which employs a transfer-type recording medium in which photosensitive pressure-sensitive sheet, or microcapsule sheet is substantially uniformly coated with microcapsules containing yellow, magenta, and cyan inks. In the color copying machine, the photosensitive sheet is exposed to light bearing image information, and those microcapsules which are exposed to the light are photo-cured, and those which are not photo-cured. The non-cured microcapsules are then ruptured under pressure to release the inks, which are reacted with the developer material on a color developer sheet to develop a colored image thereon.

Figure 1:
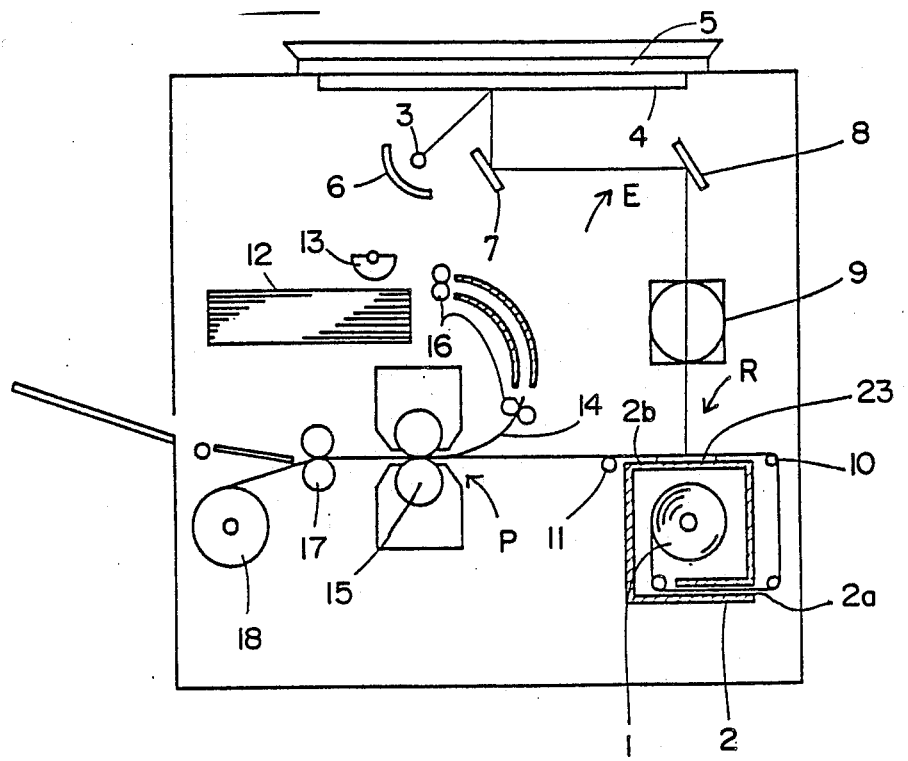
FIG. 1 is a schematic vertical cross-sectional view showing a copying machine which incorporates therein a sheet storage case of an exposure device according to the present invention; and, FIG. 2 is a perspective view showing the sheet storage case according to this invention.

As shown in FIG. 1, a copying machine has an original mount table 4 extending in horizontal direction for supporting an original 5 to be copied. The table 4 is formed of a transparent glass. The copying machine also includes an exposure unit E which includes a light source 3, an arcuate reflection plate 6, reflection mirrors 7 and 8, and a lens 9. The light source 3 is disposed directly below the original mount table 4. The reflection plate 6 and the reflection mirrors 7 and 8 are also disposed below the original mount table 5. Further, a sheet storage case or cartridge 2 is provided below the exposure unit E, and a sheet feed rollers 10 and 11 are rotatably positioned in the vicinity of both ends of the case 2. The sheet feed rollers serve as sheet feeding means for successively feeding and maintaining a photosensitive recording medium such as light transmissive photosensitive presssure sensitive sheet 1 to and at an exposure zone R mentioned later.

A color developer sheet cassette 12 is provided for storing a stack of color developer sheets 14. Further, a sector or semi-circular roller 13 is positioned above the sheet cassette 12 for feeding a single developer sheet 14 in the cassette 12. Furthermore, feed rollers 16 are provided at downstream side of the sector roller 13 for directing the developer sheet 12 toward a pressure developing unit P.

The pressure-developing unit P is provided at downstream side of the exposure zone R. The pressure-developing unit P includes a pair of pressure rollers 15 for pressing the microcapsule carrying photosensitive medium 1 and the developer sheet 14 superposed thereon. Further, a separate roller 17 is rotatably disposed at a position downstream side of the pressure developing unit P for separating the developer sheet 12 from the photosensitive sheet 1. A take-up roller 18 is provided at a downstream side of the separator roller 17 for winding the used photosensitive sheet 1.

Figure 2:
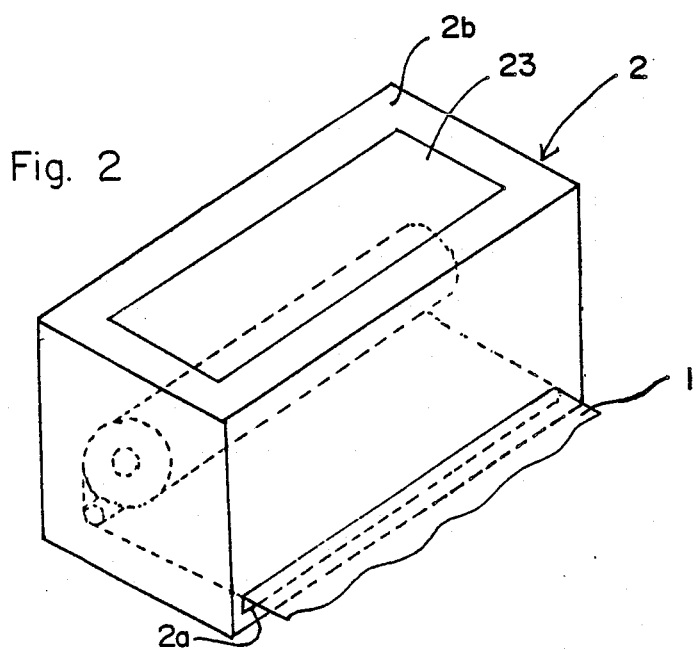

The sheet cartridge 2 is formed of a light shieldable material and stores a roll of light-transmissive photosensitive pressure-sensitive sheet 1 which is drivingly delivered by the sheet feed rollers 10 and 11. The sheet storage cartridge 2 is removably disposed in the copying machine. The photosensitive sheet 1 is withdrawn from the sheet cartridge 2 and delivered onto the upper surface 2a of the cartridge 2 by the sheet feeding means 10 and 11 in timed relation with exposure process. As illustrated in FIG. 2, the cartridge 2 is formed with a slot 2a at a side wall thereof. The rolled photosensitive sheet 1 stored in the sheet cartridge 2 can be delivered through the slot 2a. The light from the lens 9 is focussed on the photosensitive sheet 1 which is held flatwise on the upper surface 2b between the sheet feed rollers 10, 11. Importantly, in the present invention, the upper surface 2a of the cartridge 2 serves as the exposure zone R.

To the upper surface 2b or exposure zone of the sheet storage cartridge 2, there is attached a color-tone controlling means such as a color-tone controlling sheet 23 by a pressure-sensitive adhesive. As shown in FIG. 1, the cartridge 2 is disposed underneath the horizontal feed path of the photosensitive sheet 1. The color-tone controlling sheet 23 on the upper surface 2b of the cartridge 2 is held in intimate contact with the lower surface of the photosensitive sheet 1 in the horizontal feed path in the exposure zone R where the scanning line from the lens 9 is focussed on the photosensitive sheet 1.

The color-tone controlling sheet 23 has light reflectivities at respective wavelengths selected according to the sensitivities of the microcapsules of yellow, magenta, and cyan on the photosensitive sheet 1 in order to compensate for irregularities of the sensitivities of the photosensitive sheet 1 which tend to be caused in the sheet-manufacturing process. More specifically, the light reflectivities at the respective sensitivity wavelengths are varied, or increased or reduced, with respect to reference levels for the sensitivities of the yellow, magenta, and cyan microcapsules. For example, if the sensitivity of the cyan microcapsules is lower than the reference level for the cyan microcapsules in the manufacturing process, then a color-tone controlling sheet with a higher reflectivity for the cyan wavelength range is provisionally attached to the exposure zone R (upper surface 2b of the cartridge 2) for color correction. To attain this, if the yellow color is insufficient in the final output image due to variation in sheet production, yellow color may be provided on the color-tone controlling sheet 23. As a result, final output yellow color-tone can be enhanced. Further, if the cyanic and yellow color are insufficiently visualized in the final output image, a mixture of yellow and cyanic colors are provided in the color-tone controlling sheet 23. In the present invention, such selected color-tone controlling sheet 23 is provisionally affixed to the sheet storage cartridge 2, and therefore, it is not necessary for the operator to select the color-tone control sheet contrary to the invention disclosed in the copending U.S. patent application Ser. No. 154,235.

In operation, when scanning light is emitted from the light source 3 toward the original 5 on the original mount table 4, the scanning light is reflected from the original 5 toward the reflecting mirror 7. The light reflected by the reflecting mirror 7 is then reflected by the reflecting mirror 8 and passed through the lens 9 onto an exposure zone.

When light from the exposure light source 6 is applied to the photosensitive sheet 1 in the exposure zone R, light that has passed through the photosensitive sheet 1 is reflected back toward the photosensitive sheet 1 according to the reflectivity distribution of the color-tone controlling sheet 23. Therefore, the photosensitive sheet 1 is exposed to the light applied directly from the lens 9 and also to the back light reflected from the color-tone controlling sheet 23. As a result, sufficient light having specific wavelength corresponding to the wavelength sensitivities which is insufficient in the sheet 1 is irradiated on the sheet 1 because of the double exposure. Those microcapsules on the photosensitive sheet 1 which are exposed to the light are photo-cured, whereas those which are not remain unset. After the photosensitive sheet 1 has been exposed, it is fed along from the exposure zone R, and at the same time the color developer sheet 12 is delivered from the color developer sheet cassette 12 by the semi-circular roller 13 and fed by feed rollers 16 into overlapping relation to the photo-sensitive sheet 1. Then, the color developer sheet 12 and the photosensitive sheet 1 are pressed together to rupture the unset microcapsules to develop an colored image on the color developer sheet 12 by the pressure developing unit P. The color developer sheet 12 with the developed colored image thereon is then discharged out of the copying machine by the separator rollers 17. The photosensitive sheet 1 on which the unset microcapsules have been ruptured and the photoset microcapsules remain intact are wound on the takeup roll 18.

The color-tone controlling sheet 23 is shown as being applied to the sheet storage cartridge 2 by a pressure-sensitive adhesive. However, a reflecting surface which is functionally equivalent to the color-tone controlling sheet 23 may be formed on the sheet storage cartridge 2 as a coated layer or a painted layer those serving as the color-tone controlling means.

With the present invention, it is not necessary to provide an exposure table as a separate member for preventing applied light that has passed through the photosensitive sheet from being subjected to diffused reflection. The color-tone controlling sheet can reflect the passed light as desired to correct for variations caused in the sensitivities of the microcapsules on the photosensitive sheet in the sheet manufacturing process. Therefore, copies bearing high-quality images of increased sharpness and resolution can be produced at all times.

Further, in the present invention, it is not necessary to consider the drawbacks attendant to the double exposure in the conventional case, since the double exposure is rather requisite process for compensating the color-tone in the final output image. Furthermore, in the present invention, it is unnecessary for the operator to select one of the suitable color-tone controlling sheet or members, since optimum color-tone controlling member 23 is provisionally attached to the sheet cartridge 2 in accordance with the specific sensitivities inherently given to the sheet 1 due to non-uniform sheet production at every lot to lot. Moreover, in the present invention, a compact copying machine can be provided, since the sheet cartridge 2 also serves as the exposure zone R.

While the invention has been described in detail with reference to a specific embodiment thereof, it would be apparent to those skilled in the art that various changes and modifications can be made therein without departing from the spirit and scope of the invention. For example, the above-described self contained type recording medium can be stored in the sheet cartridge 2. In this cartridge, the above described sheet cassette 12, the sector roller 13, the feed rollers 16 and the separate rollers 17 are deemed to be unnecessary.

What is claimed is:

1. An exposure device for use in an image recording apparatus for exposing a photosensitive recording medium to light so as to form a latent image thereon, said medium having a first and second surfaces, said device comprising:

a sheet storage cartridge detachably provided to said image recording apparatus, said cartridge being formed of a light-shielding material for storing therein said photosensitive recording medium and having an exposure zone on an outer surface thereof when installed in said recording apparatus;

exposure means which emits an original image carrying light directing in alignment with said outer surface for exposing said first surface of said photosensitive medium to light in said exposure zone to form said latent image on said photosensitive medium;

sheet feeding means driven in timed relation with an exposure for pulling said photosensitive recording medium from said sheet cartridge and positioning said medium on said outer surface; and, a color-tone controlling means fixed to said outer surface and having a reflectivity distribution for exposing said second surface of said photosensitive recording medium for correcting exposure amount with respect to said photosensitive medium with at least one of specific light having at least one of selected wavelengths.

2. The exposure device as defined in claim 1, wherein said photosensitive recording medium comprises a transfer-type recording medium in which an encapsulated chromogenic material is deposited on a first substrate and a developer material is coated on a second substrate as a separate developer sheet, said latent image being provided on said first substrate at said exposure zone.

3. The exposure device as defined in claim 1, wherein said photosensitive recording medium comprises a self-contained type recording medium in which an encapsulated chromogenic material and a developer material are co-deposited on one surface of a single substrate, said latent image being provided on said single substrate at said exposure zone.

4. The exposure device as defined in claim 1, wherein said color-tone controlling means comprises a sheet having at least one of color selected from cyan, magenta and yellow.

5. The exposure device as defined in claim 1, wherein said color-tone controlling means comprises a sheet having color mixture of at least two colors selected from cyan, magenta and yellow.

6. The exposure device as defined in claim 1, wherein said color-tone controlling means comprises a paint provided on said outer surface.

7. The exposure device as defined in claim 1, wherein said color-tone controlling means has one surface in intimate contact with said second surface of said photosensitive recording medium, and has another surface fixed to said outer surface of said cartridge.

* * * * *